United States Patent
Guimaraes

(10) Patent No.: US 7,450,665 B2
(45) Date of Patent: Nov. 11, 2008

(54) METHOD AND APPARATUS TO IMPLEMENT DC OFFSET CORRECTION IN A SIGMA DELTA CONVERTER

(75) Inventor: Homero L. Guimaraes, Round Lake Beach, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 767 days.

(21) Appl. No.: 10/731,850

(22) Filed: Dec. 9, 2003

(65) Prior Publication Data

US 2005/0123072 A1    Jun. 9, 2005

(51) Int. Cl.
*H04L 25/06* (2006.01)
(52) U.S. Cl. .................... 375/319; 375/316
(58) Field of Classification Search ............. 375/319; 341/143, 150, 172
See application file for complete search history.

(56) References Cited

U.S. PATENT DOCUMENTS

| | | | | |
|---|---|---|---|---|
| 6,005,506 A | * | 12/1999 | Bazarjani et al. | 341/143 |
| 6,040,793 A | * | 3/2000 | Ferguson et al. | 341/143 |
| 6,204,787 B1 | * | 3/2001 | Baird | 341/139 |
| 6,313,685 B1 | * | 11/2001 | Rabii | 327/307 |
| 6,400,295 B1 | | 6/2002 | Van Herzeele | |
| 6,504,498 B1 | | 1/2003 | O'Brien | |
| 6,529,015 B2 | * | 3/2003 | Nonoyama et al. | 324/678 |

* cited by examiner

*Primary Examiner*—David C. Payne
*Assistant Examiner*—Leon Flores

(57) ABSTRACT

A sigma delta converter configured for DC offset correction is presented. The sigma delta modulator has integrator circuitry including an integrator input and an integrator output. An input signal received at the integrator input has an input AC voltage component and a DC offset component. Capacitors are connected to the integrator input, and a first set of switches is connected to the pair of capacitors. The first set of switches transfer a first charge to the pair of capacitors during a first phase, and a second set of switches transfer the first charge and a second charge to the integrator input.

19 Claims, 4 Drawing Sheets

METHOD AND APPARATUS TO IMPLEMENT DC OFFSET CORRECTION IN A SIGMA DELTA CONVERTER

BACKGROUND

1. Field of the Disclosure

The present disclosure relates to signal processors, and more particularly, to signal processing using sigma delta converters.

2. Description of the Related Art

A frequency modulation/demodulation approach is commonly used to transmit digital data over a wireless system. A transmitting modulator within a transmitting device modulates a baseband signal at a carrier frequency into an antenna. A demodulator in a receiving device provides a signal, commonly referred to as a baseband signal b(t), that is representative of the information being sent from the transmitting device to the receiving device. The demodulator extracts (i.e., demodulates) the baseband signal b(t) from the carrier frequency, that is, the high frequency wireless signal that "carries" the baseband signal b(t) through the medium (e.g., airspace) separating the transmitting and receiving devices.

If the baseband signal corresponds to a given logic value, for example, in a digital Frequency Shift Keying modulation scheme (FSK), the baseband signal represents a "1" when the signal has a frequency of ($f_{carrier}+f_0$). If the baseband signal represents a "0", the signal has a frequency of ($f_{carrier}-f_0$). Thus, the signal launched alternates between frequencies of ($f_{carrier}+f_0$) and ($f_{carrier}-f_0$) depending on the value of the data being transmitted. Note that in actual practice the transmitted signal can have a profile that is distributed over a range of frequencies in order to prevent that a large, instantaneous changes in channel propagation in a small frequency range distorts significantly the signal. The carrier frequency $f_{carrier}$ corresponds to the particular wireless channel that the digital information is being transmitted within. In typical wireless communications systems the digital modulation schemes are more complex like in Quadrature Phase Shift Keying (QPSK) and Quadrature Amplitude Modulation (QAM) systems. In some communications systems signal spreading is used by multiplying the baseband signal by higher frequency binary code, as in Wideband Code Division Multiple Access systems (W-CDMA).

The net result of such techniques is that the bandwidth of the modulated RF signal is increased and can have a significant Amplitude Modulated (AM) component. Therefore, more linearity is needed in the receiver circuits to avoid inadvertently demodulating the AM component by a second-order or third order non-linearity in the amplifiers and mixers, resulting in translating the whole signal back to baseband and creating a DC signal that can be several orders of magnitude higher than the signal being detected. Such a shift in DC magnitude makes it harder to detect the transmitted signal and can cause clipping.

In a Direct Conversion Receiver (DCR), there is another cause of DC offsets related to the Local Oscillator (LO) frequency leaking out to the antenna as a result of the LO frequency being the same as the RF channel. In this scenario the LO signal is thereby transmitted and subsequently reflected back to the antenna by obstructions nearby. When this reflected signal reaches the mixer, it is multiplied by the LO signal which converts it down to DC level, where, due to its high DC power component, it can clip the baseband components after the mixer, thereby wiping out the desired signal.

Another leakage path for the LO frequency is through the mixer: from the LO port to the RF port directly. In both cases the effect is a high DC offset component that is destructive of the desired signal, causing non-linearities.

Such a DC offset should be corrected to assure proper interpretation of the transmitted signal. Current DC offset correction schemes put a heavy burden on the noise specifications of the whole receive line-up by injecting noise into the receive path. As CMOS-only radios become popular, that is, as radio frequency (RF) circuitry and baseband circuitry are increasingly combined onto a single CMOS integrated circuit, noise injection reduction becomes increasingly important.

A DC offset correction technique that minimizes the amount of noise injected into the receive path so as to minimally impact the noise figure of the receiver is desired.

BRIEF DESCRIPTION OF THE DRAWINGS

The present disclosure may be better understood, and its numerous features and advantages made apparent to those skilled in the art by referencing the accompanying drawings.

The use of the same reference numbers in different drawings indicates similar or identical items.

DESCRIPTION OF THE PREFERRED EMBODIMENT(S)

A receiver path includes a sigma delta converter configured to correct DC offset. A continuous-time sigma delta loop filter and a switched capacitor Digital to Analog Converter (DAC) in the feedback path are combined to form the sigma delta converter. The switched capacitor DAC transfers charge to inputs of a first integrator of the sigma delta converter correcting for DC offset as well as performing its conventional feedback operation inside a sigma-delta loop. By modifying the sigma delta converter, noise injected by DC offset correction is reduced.

Figure 1:
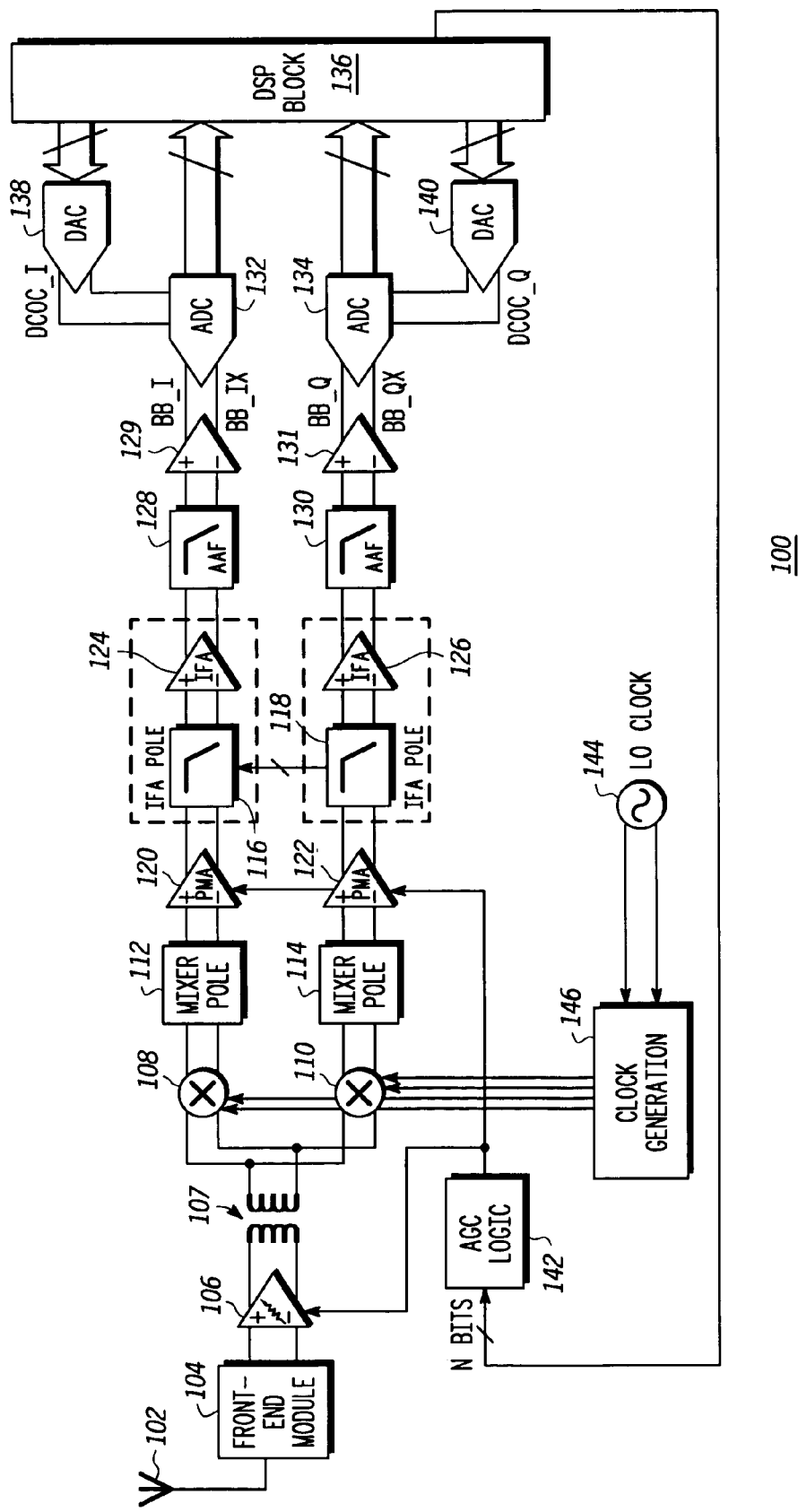
FIG. 1 illustrates a receiver according to an embodiment of the present disclosure.

FIG. 1 illustrates a receiver 100 according to an embodiment of the present disclosure. FIG. 1 illustrates a front end module 104 having an output connected to amplifier 106. An output of amplifier 106 is connected to down converter of 107. Each of a first and second output of down converter 107 is connected to mixers 108 and 110. Mixer 108 has an output that is connected to filter 112. Filter 112 has an output that is connected to amplifier 120. Amplifier 120 has an output that is connected to filter 116. Filter 116 has an output that is connected to amplifier 124. Amplifier 124 has an output connected to anti-aliasing filter 128. Anti-aliasing filter 128 has an output connected to amplifier 129. Amplifier 129 has an output coupled to the analog-to-digital converter 132. The analog-to-digital converter 132 has an output connected to DSP block 136. DSP block 136 has a first output connected to digital-to-analog converter 138. Digital-to-analog converter 138 has an output connected to the analog-to-digital converter 132. Mixer 110 has an output that is connected to filter 114. Filter 114 has an output that is connected to amplifier 122. Amplifier 122 has an output that is connected to filter 118. Filter 118 has an output that is connected to amplifier 126. Amplifier 126 has an output connected to anti-aliasing filter 130. Anti-aliasing filter 130 has an output connected to amplifier 131. Amplifier 131 has an output coupled to the analogto-digital converter 134. The analog-to-digital converter 134 has an output connected to DSP block 136. DSP block 136 has a second output connected to digital-to-analog converter 140. Digital-to-analog converter 140 has an output connected to the analog-to-digital converter 134, and a third output connected to an automatic gain control block 142. automatic gain control block 142 has an output connected to amplifier 106 and to amplifiers 120 and 122. A local oscillator 144 has an output connected to clock generator 146. Clock generator 146 connected to mixers 108 and 110 using differential signals.

Radio frequency (RF) signals are received by antenna 102. The signal received by antenna 102 may contain not only every channel within the frequency band of interest, but also extraneous signals (e.g., AM and FM radio stations, TV stations, etc.) outside the frequency band. The extraneous signals are filtered by a front end module 104 such that only the frequency band of interest is passed. The front end module 104 output signal is then amplified by an amplifier 106.

The amplified signal is directed to a first mixer 108 and a second mixer 110 through coupling transformer 107, specifically, a pair of differential down conversion signals $d1(t)$, $d2(t)$ that are 90° out of phase with respect to each other are generated by block 146, i.e., the LO frequencies in quadrature, whereby down conversion signal $d1(t)$ is directed to the first mixer 108 and down conversion signal $d2(t)$ is directed to the second mixer 110. Each mixer multiples its pair of input signals to produce a I/Q baseband output signal. Transmitting a pair of signals that are 90° out of phase with respect to one another conserves airborne frequency space by a technique referred to in the art as single sideband transmission.

The frequency $f_{down}$ of both down conversion signals $d1(t)$, $d2(t)$ is designed to be the same as the central RF channel in the DCR example as shown, or it can be mapped to $f_{carrier}-f_{IF}$ as in a super-heterodyne receiver, in which case the difference between the down conversion frequency $f_{down}$ and the carrier frequency $f_{carrier}$ is referred to as the intermediate frequency $f_{IF}$. In the DCR example shown in FIG. 1 the output of both mixers 108 and 110 are the I and Q baseband signals. The filters 112, 114, 116, and 118 attenuate the out-of-band interferers as well as the adjacent channels to increase the signal-to-noise ratio at the input of the Analog to digital converter (ADC) and to avoid the clip of the ADC and analog baseband stages as well.

Amplification stages 120 and 122 have sufficient amplification to take over the noise generated by the rest of the baseband line-up, i.e., the filters and ADC. As explained previously, filters 116 and 118 filter away higher frequency interferers as well as the strong adjacent channels signals. Thus, amplification stages 120 and 122 and filters 116 and 118 act to produce a signal with the correct amplitude at the input of the ADC to allow use of most of its dynamic range as well as filtering out the higher amplitude interferers, thus simplifying the complexity of the ADC in terms of numbers of bits.

After filters 116 and 118, the signals are presented to intermediate frequency amplifiers (IFAs) 124 and 126, respectively. Outputs of IFAs 124 and 126 are filtered by anti aliasing filters (AAFs) 128 and 130, respectively. The AAF filters limit the bandwidth of the signal in preparation for the sampling operation inside the ADC. Outputs of AAFs 128 and 130 are received by sigma delta converters 132 and 134 after being buffered by blocks 129 and 131. Sigma delta converters 132 and 134 are also referred to as sigma delta analog to digital converters (ADC). Digital signal processor (DSP) 135 receives the outputs of sigma delta converters 132 and 134. DSP block 136 calculates the DC offset and provides a DC offset correction as a binary multi-bit code word to the digital to analog converters (DACs) 138 and 140. DACs 138 and 140 then inject analog signals proportional to the offset in the sigma delta ADCs 132 and 134 at a point inside the sigma-delta ADC where the baseband signal has its maximum amplitude after having passed through all the amplifiers.

DSP 136 also provides automatic gain control (AGC) information to AGC logic 142 for the control of amplifiers 106, 120 and 122. Receiver path 100 includes various oscillators including local oscillator 144 for Local Oscillator frequency generation logic 146 used in mixers 108 and 110.

Figure 2:
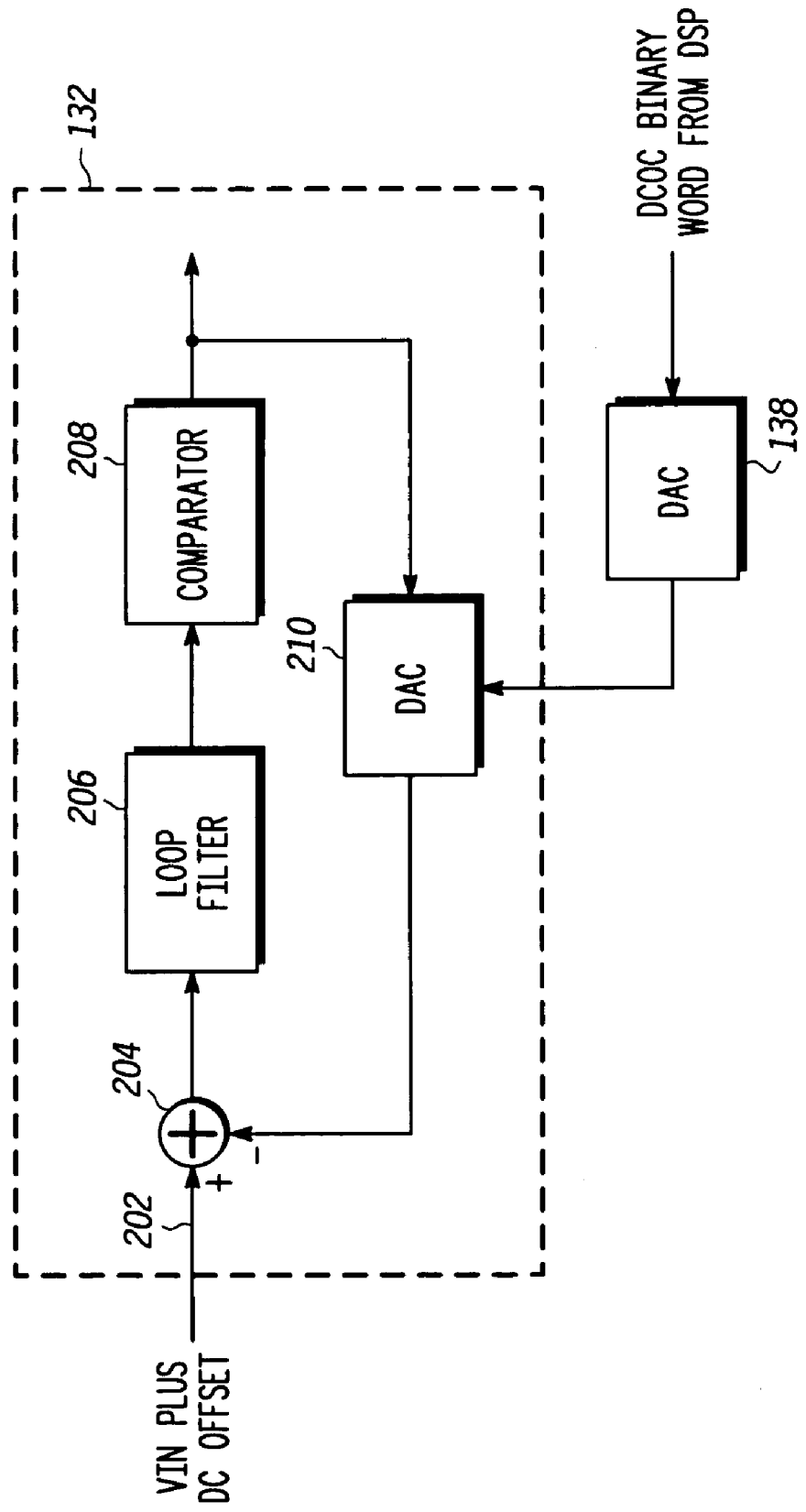
FIG. 2 illustrates a sigma delta converter of FIG. 1.

FIG. 2 illustrates in greater detail a configuration for sigma delta converters 132 and 134 of FIG. 1. For purposes of discussion, sigma delta converter 132 is discussed. FIG. 2 illustrates an adder 204 having an output connected to loop filter 206. Loop filter 206 has an output connected to comparator 208. Comparator 208 has an output that is provided to DSP Block 136 and connected to DAC 210. DAC 210 has an output connected to the adder 204. An output from DAC 138 is connected to DAC 210. An analog input signal 202, corresponding to the differential input to sigma delta converter 132, has a DC offset component and is fed to the converter through a first input terminal of summer 204. The output of summer 204 is connected to loop filter 206, this is a N-order filter where N is an integer indicating the number of stages which can be one or more low-pass filters, that can be composed of integrators. Loop filter 206 can be continuous time or discrete-time filters, such as switched capacitor filters. The output of loop filter 206 is an analog signal and is fed to comparator 208. Comparator 208 is a one bit quantizer. The digital output of comparator 208 is fed back through a switched-capacitor DAC 210, to a second input of summer 204 negatively, completing the feed back loop of the sigma delta converter. In addition, DC offset correction voltage, such as is defined by a binary word provided from the DSP Block 136, is converted to an analog signal DCOC_I by DAC 138 and is input to DAC 210 to perform a DC offset correction.

Figure 3:
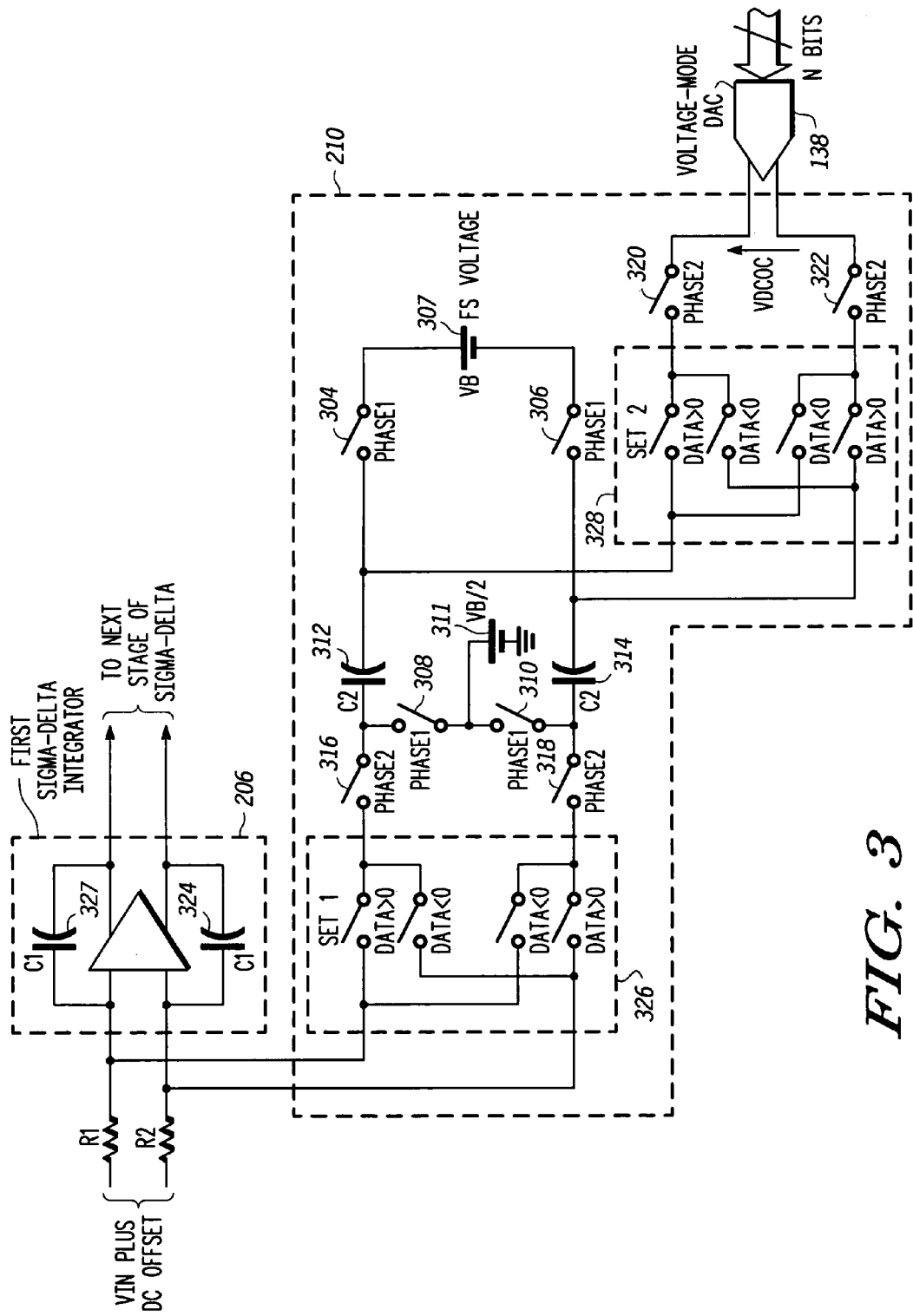
FIG. 3 illustrates a portion of the sigma delta converter of FIG. 2.

FIG. 3 illustrates a portion of the sigma delta converter of FIG. 3. FIG. 3 illustrates resistive elements R1 and R2 connected to loop filter 206 and cross point switch 326. Cross point Switch 326 has a first output connected to a first terminal of switch 316 and a second output connected to first terminal of switch 318. Switch 316 has a second terminal connected to switch 308 and to a first terminal of capacitor 312. Switch 318 has a second terminal connected to switch 310 and to a first terminal of capacitor 314. Second terminals of switches 308 and 310 are connected to voltage reference 311. Capacitor 312 has a second terminal connected to switch 304 and to cross point switch 328. Capacitor 314 has a second terminal connected to switch 306 and to cross point switch 328. Second terminals of switches 304 and 306 are connected to voltage reference 307. Cross point switch has a first output connected to first terminal of switch 320, and a second output connected to a first terminal of switch 322. Second terminals of switches 320 and 322 are connected to DAC 138.

Input signal Vin has an AC component, the desired baseband signal, and a DC offset component. Vin is fed to the loop filter 206, which includes the illustrated integrator loop filter. The integrator of 206 is a continuous-time integrator. During a first phase, phase 1, switches 304, 306, 308 and 310 are closed and a pair of DAC capacitors 312 and 314 are charged to reference voltage Vb/2, provided by component 311 and 307, which is half the ADC full-scale voltage VB. During a second phase, phase 2, switches 316, 318, 320 and 322 are closed and capacitors 312 and 314 are connected in series with a DC offset correction voltage from DAC 138.

A first set of switches 326 control the polarity of the feedback charge applied to the inputs of the integrator of 206 as directed by the outputs of the comparator (not shown) coupled to the last integrator stage (not shown) of the sigma delta converter. A second set of switches 328 control the polarity of the DC offset correct voltage to always substantially cancel the DC offset component of Vin independently of the state of the sigma-delta comparator.

A charge proportional to the sum of Vb and Vdcoc is transferred to the inputs of integrator of 206. The charge injected by the DC voltage has an opposite signal polarity to the DC offset component of Vin.

Figure 4:
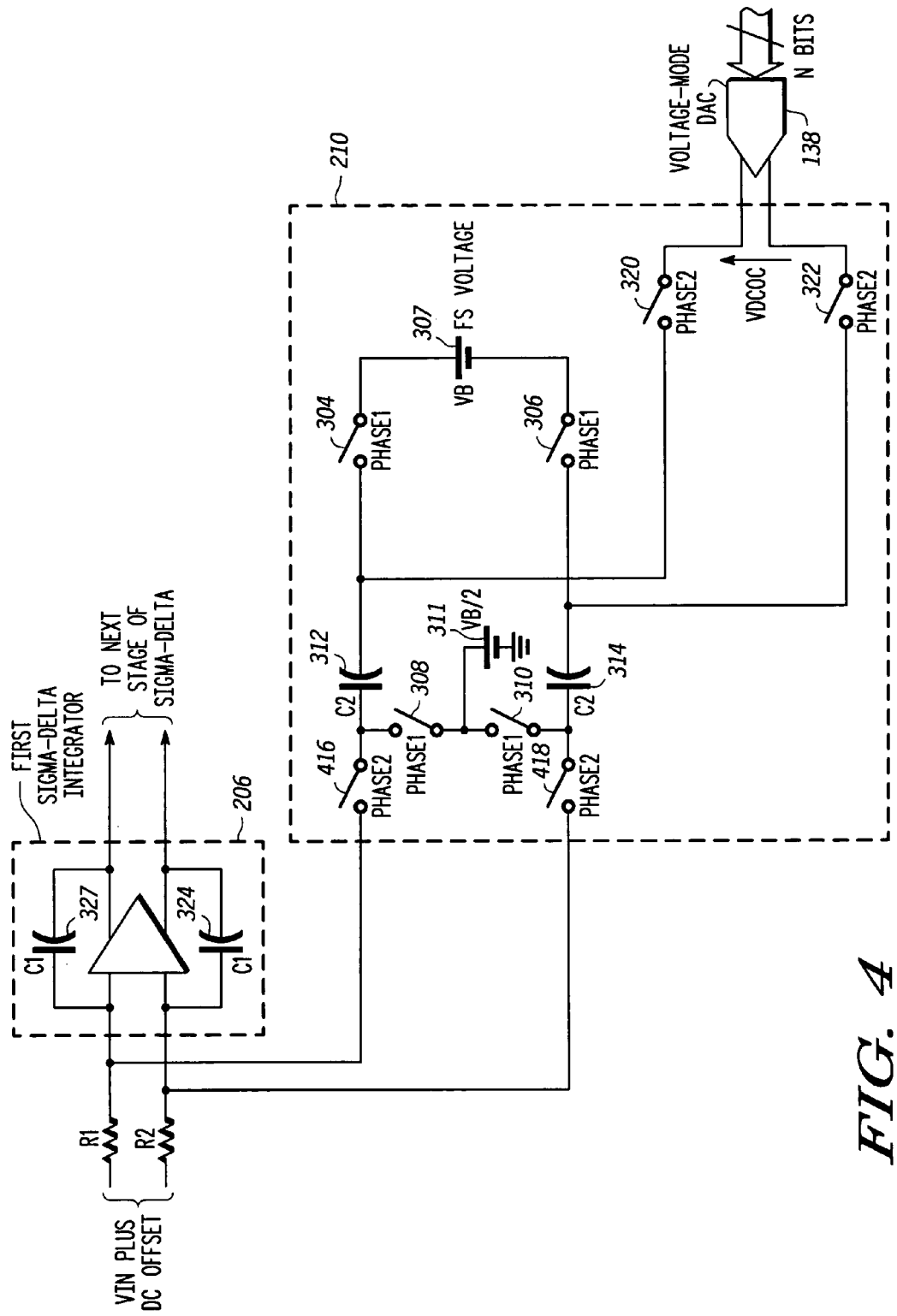
FIG. 4 illustrates a simplified switched capacitor circuit of the sigma delta converter of FIG. 3.

In order to better explain the operation of the embodiment, FIG. 4 illustrates a simplified switched capacitor circuit of the sigma delta converter of FIG. 3. In particular, the output of the comparator of the sigma delta converter is assumed to be greater than zero (data>0) at this particular instant The same analysis can be done assuming the output of the comparator of the sigma delta converter less than zero (data<0) with the same result. As shown, integrator 206 is the first integrator of the loop filter. During phase 1 switches 304, 306, 308 and 310 are closed and C2 capacitors 312 and 314 are charged to Vb/2.

$$Q_{C2} = 2 \cdot C_2 \cdot \frac{Vb}{2} = C_2 \cdot Vb$$

During phase 2 switches 416, 418, 320 and 322 are closed and the charge of capacitors 312 and 314 is transferred to the inputs of integrator 206. Also during phase 2, a DC offset correction charge proportional to the DC offset component of Vin is transferred to the inputs of integrator of 206. DC offset correction DAC 138 generates the DC offset correction voltage by converting the DC offset correction control binary word from the DSP.

During phase 2 the differential DC voltage created by the DAC 138 is applied in series with the capacitors 312 and 314 and thus a charge proportional to this voltage is also transferred. At the end of the phase 2, after the charge transfer ends, we have:

$$Q_{C2} = -2 \cdot C_2 \cdot \frac{Vdcoc}{2}$$

The overall charge transferred is:

$$\Delta Q_{C2} = 2 \cdot C_2 \cdot \left(\frac{Vb}{2} + \frac{Vdcoc}{2}\right) = C2(vb + Vdcoc)$$

This charge difference has to be transferred to the C1 capacitors 327 and 324, therefore:

$$\Delta Q_{c2} = \Delta Q_{C1}$$

$$C2 \cdot (Vb + Vdcoc) = 2 \cdot C1\left(\frac{Vout}{2}\right)$$

$$Vout = \frac{C2}{C1} \cdot (Vb + Vdcoc)$$

In another embodiment, if the polarity of the DC voltage at the output of the DCOC DAC block 138 (Vdcoc) is inverted (useful when the input DC component at the input has opposite polarity than the one shown), a subtraction would occur:

$$Vout = \frac{C2}{C1} \cdot (Vb - Vdcoc)$$

Meanwhile the DC offset present at the input signal to the sigma-delta converter is also integrated during one sampling cycle in integrator 206 as:

$$Q_{dc} = \frac{1}{C1} \cdot \int_0^{Ts} \frac{Vdc}{R1} \cdot dt \cong \frac{Vdc \cdot Ts}{R1 C1}$$

The approximation above is due to the high over-sampling factor in the sigma-delta converter such that the variation is negligible from one sample to the next one.

In order to compensate this extra charge a voltage is applied via DC offset correction DAC 138:

$$\frac{Vdc \cdot Ts}{R1 C1} = \frac{C2}{C1} \cdot Vdcoc$$

If Vdcoc=Vdc (the value provided by DAC 138 is substantially close to the DC offset of the input signal Vin), We have to design C2=Ts/R1 and the DC component at the input is thus compensated.

The switched capacitor feedback path is limited by the KT/C noise. By changing the value of the capacitances, the noise injected can be reduced. Due to this fact the design of the DC offset correction DAC 138 is simpler since its noise is not the dominant factor anymore. The sigma delta converter of the present disclosure implements a DC offset correction scheme by moving the DC offset correction point of injection to the sigma-delta converter. At this stage of the receive path the signal level is higher and the impact of the injected noise is smaller.

Although the above figures have described a continuous time sigma delta converter, the present disclosure can be implemented with a discrete time sigma delta converter.

The above-disclosed subject matter is to be considered illustrative, and not restrictive, and the appended claims are intended to cover all such modifications, enhancements, and other embodiments that fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A sigma delta converter comprising:
   integrator circuitry including an integrator input and an integrator output, wherein an input signal coupled to the integrator input has an input AC voltage component and a DC offset component;
   a pair of capacitors coupled to the integrator input;
   a first set of switches coupled to the pair of capacitors, the first set of switches configured to transfer a first charge to the pair of capacitors during a first phase, the first charge proportional to a reference voltage; and
   a second set of switches coupled between the pair of capacitors and the integrator input, the second set of switches configured to transfer the first charge and a second charge to the integrator input during a second phase, the second charge proportional to the DC offset component and based on a voltage applied in series with the pair of capacitors during the second phase.

2. The sigma delta converter, as recited in claim 1, further comprising:
a comparator coupled to the integrator circuitry output, the comparator including a comparator output.

3. The sigma delta converter, as recited in claim 1, wherein the integrator circuitry comprises N integrators coupled in series forming an Nth-Order sigma delta loop filter, each of the N integrators having a first input, a second input, a first output and a second output, each of the N integrators having a first integrator capacitor coupled to the first input and the first output and a second integrator capacitor coupled to the second input and the second output.

4. The sigma delta converter, as recited in claim 1, further comprising:
a comparator coupled to the integrator circuitry output, the comparator including a comparator output;
a third set of switches coupled to the pair of capacitors, the third set of switches configured to change a polarity of the first charge and the second charge based on the comparator output; and
a fourth set of switches coupled to the pair of capacitors, the fourth set of switches configured to change a polarity of the second charge based on the comparator output, wherein the polarity of the second charge is configured to cancel the DC offset component of the input signal.

5. The sigma delta converter, as recited in claim 1, further comprising:
a digital to analog converter coupled to the pair of capacitors for producing the second charge.

6. The sigma delta converter, as recited in claim 5, the digital to analog converter configured to receive a multi-bit code word input from a digital signal processor.

7. The sigma delta converter, as recited in claim 1, wherein the integrator is a continuous time integrator.

8. The sigma delta converter, as recited in claim 1, wherein the integrator is a discrete time integrator.

9. A radio frequency (RF) signal receive path comprising:
an intermediate frequency amplifier (IFA) including an IFA output;
a plurality of anti-aliasing filters (AAFs) coupled to the IFA output, the AAFs having an AAF output; and
a sigma delta converter coupled to the AAF output, the sigma delta converter comprising:
integrator circuitry including an integrator input and an integrator output, wherein an input signal coupled to the integrator input has an input AC voltage component and a DC offset component;
a pair of capacitors coupled to the integrator input;
a first set of switches coupled to the pair of capacitors, the first set of switches configured to transfer a first charge to the pair of capacitors during a first phase, the first charge proportional to a reference voltage; and
a second set of switches coupled to the pair of capacitors, the second set of switches configured to transfer the first charge and a second charge to the integrator input during a second phase, the second charge proportional to the DC offset component and based on a applied in series with the pair of capacitors during the second phase.

10. The RF signal receive path, as recited in claim 9, wherein the integrator circuitry comprises N integrators coupled in series forming an Nth-Order sigma delta converter, each of the N integrators having a first input, a second input, a first output and a second output, each of the N integrators having a first integrator capacitor coupled to the first input and the first output and a second integrator capacitor coupled to the second input and the second output.

11. The RF signal receive path, as recited in claim 9, the sigma delta converter further comprising:
a comparator coupled to the integrator output, the comparator including a comparator output;
a third set of switches coupled to the pair of capacitors, the third set of switches configured to change a polarity of the first charge and the second charge based on the comparator output; and
a fourth set of switches coupled to the pair of capacitors, the fourth set of switches configured to change a polarity of the second charge based on the comparator output, wherein the polarity of the second charge is configured to cancel the DC offset component of the input signal.

12. The RF signal receive path, as recited in claim 9, the sigma delta converter further comprising:
a digital to analog converter coupled to the pair of capacitors for producing the second charge.

13. The RF signal receive path, as recited in claim 12, the digital to analog converter configured to receive a multi-bit code word input from a digital signal processor.

14. The RF signal receive path, as recited in claim 9, wherein the integrator is a continuous time integrator.

15. The RF signal receive path, as recited in claim 9, wherein the integrator is a discrete time integrator.

16. A method comprising: during a first phase, charging a pair of capacitors to a reference charge; during a second phase, applying a voltage in series with the pair of capacitors to provide a DC offset correction charge; and during the second phase, transferring a sum charge via the pair of capacitors to inputs of a first integrator in a series of integrators in a sigma delta converter, the sum charge including the reference charge and the DC offset correction charge; comparing an output of a last integrator in the series of integrators to a zero value; and determining a polarity of the reference charge in the sum charge based on a result of the comparing.

17. The method, as recited in claim 16, wherein a polarity of the DC offset correction charge in the sum charge is independent of a result of the comparing.

18. The sigma delta converter of claim 1, wherein:
the pair of capacitors comprises a first capacitor having a first terminal and a second terminal and a second capacitor having a first terminal and a second terminal;
the first pair of switches comprises:
a first switch comprising a first terminal coupled to a first terminal of a first voltage reference and a second terminal coupled to the first terminal of the first capacitor;
a second switch comprising a first terminal coupled to a second terminal of the first voltage reference and a second terminal coupled to the first terminal of the second capacitor;
a third switch comprising a first terminal coupled to the second terminal of the first capacitor and a second terminal coupled to a second voltage reference; and
a fourth switch comprising a first terminal coupled to the second terminal of the second capacitor and a second terminal coupled to the second voltage reference; and
the second pair of switches comprises:
a fifth switch comprising a first terminal configured to receive a first voltage based on the DC offset component and a second terminal coupled to the first terminal of the first capacitor;
a sixth switch comprising a first terminal configured to receive a second voltage based on the DC offset component and a second terminal coupled to the first terminal of the second capacitor;

a seventh switch comprising a first terminal coupled to the second terminal of the first capacitor and a second terminal coupled to a first terminal of the integrator input; and an eighth switch comprising a first terminal coupled to the second terminal of the second capacitor and a second terminal coupled to a second terminal of the integrator input.

19. The radio frequency (RF) signal receive path of claim 7, wherein:

the pair of capacitors comprises a first capacitor having a first terminal and a second terminal and a second capacitor having a first terminal and a second terminal;

the first pair of switches comprises:

a first switch comprising a first terminal coupled to a first terminal of a first voltage reference and a second terminal coupled to the first terminal of the first capacitor;

a second switch comprising a first terminal coupled to a second terminal of the first voltage reference and a second terminal coupled to the first terminal of the second capacitor;

a third switch comprising a first terminal coupled to the second terminal of the first capacitor and a second terminal coupled to a second voltage reference; and a fourth switch comprising a first terminal coupled to the second terminal of the second capacitor and a second terminal coupled to the second voltage reference; and the second pair of switches comprises:

a fifth switch comprising a first terminal configured to receive a first voltage based on the DC offset component and a second terminal coupled to the first terminal of the first capacitor;

a sixth switch comprising a first terminal configured to receive a second voltage based on the DC offset component and a second terminal coupled to the first terminal of the second capacitor;

a seventh switch comprising a first terminal coupled to the second terminal of the first capacitor and a second terminal coupled to a first terminal of the integrator input; and an eighth switch comprising a first terminal coupled to the second terminal of the second capacitor and a second terminal coupled to a second terminal of the integrator input.

\* \* \* \* \*